United States Patent [19]

Halligan et al.

[11] Patent Number: 5,032,689

[45] Date of Patent: Jul. 16, 1991

[54] EMI/RFI SHIELDING VENT AND METHOD OF USE

[76] Inventors: Brian S. Halligan, 4301 Manzanita, Irvine, Calif. 92714; Eivind L. Johansen, R.R. 1, Box 464, Weare, N.H. 03281

[21] Appl. No.: 394,110

[22] Filed: Aug. 15, 1989

[51] Int. Cl.$^5$ ............................................. H05K 9/00
[52] U.S. Cl. .................................. 174/35 R; 361/424; 219/10.55 D; 29/592.1
[58] Field of Search .................... 49/485, 490, 493; 24/578, 587, 588; 220/371, 372; 174/35 R, 35 MS, 35 GC; 361/424, 381, 390; 219/10.55 D, 10.55 R; 29/592.1

[56] References Cited

U.S. PATENT DOCUMENTS

| | | | |
|---|---|---|---|
| 1,765,443 | 6/1930 | Peterson | 174/35 GC |
| 1,879,340 | 9/1932 | Lamping | 49/490 |
| 3,026,367 | 3/1962 | Hartwell | 174/35 |
| 3,059,292 | 10/1962 | Harris | 20/69 |
| 3,140,342 | 7/1964 | Ehrreich et al. | 174/35 |
| 3,206,536 | 9/1965 | Goodloe | 174/35 R |
| 3,546,359 | 12/1970 | Ciccarelli et al. | 174/35 |
| 3,580,981 | 5/1971 | Lamp et al. | 174/35 |
| 3,584,134 | 6/1971 | Nichols et al. | 174/35 MS |
| 3,821,463 | 6/1974 | Bakker | 174/35 |
| 4,215,258 | 7/1980 | Nelson et al. | 219/10.55 |
| 4,525,904 | 7/1985 | Petri | 24/458 |
| 4,535,565 | 8/1985 | Erickson | 49/493 |
| 4,652,695 | 3/1987 | Busby | 174/35 |
| 4,659,869 | 4/1987 | Busby | 174/35 |
| 4,793,509 | 12/1988 | Coleman | 220/372 |

FOREIGN PATENT DOCUMENTS 768996 2/1957 United Kingdom .

OTHER PUBLICATIONS

Metex, Electronic Weatherstrip and RF Gaskets, and Metex, Catalog ME-14.

Primary Examiner—Leo P. Picard
Assistant Examiner—Bot L. Ledynh
Attorney, Agent, or Firm—Celia H. Ketley; William L. Baker

[57] ABSTRACT

An EMI/RFI shielding panel assembly is provided which is lightweight and easily and economically manufactured. The panel assembly of the invention may comprise one or more hinged members which snap together to form a closed frame having a filter media panel disposed therein, or may alternately comprise an integral frame having a filter media panel disposed therein or attached to the surface thereof.

46 Claims, 2 Drawing Sheets

EMI/RFI SHIELDING VENT AND METHOD OF USE

BACKGROUND OF THE INVENTION

The operation of conventional electronic equipment is typically accompanied by the generation of radio frequency and/or electromagnetic radiation in the electronic circuitry of the electronic system. If not properly shielded, such radiation can cause considerable interference with unrelated equipment. Accordingly, it is necessary to effectively shield and ground all sources of radio frequency and electromagnetic radiation within the electronic system.

When the radiation-generating equipment is permanently housed in a container, effective shielding may generally be accomplished through proper construction of the enclosure. However, the thus contained equipment often must be cooled or ventilated by the use of vent openings in the shielding enclosure. It is desired that the necessary cooling be obtained while retaining the maximum possible EMI/RFI shielding. Framed electrically conductive panels have been used as vent panels in shielded enclosures, but these conventional panels are not economical to manufacture, as the frame must be welded together at each corner and each welded joint must subsequently be ground to a flat surface. Conventional vent panels also are often undesirably thick and heavy.

The present invention provides a novel EMI/RFI shielding vent panel which is lightweight and easily and economically assembled.

SUMMARY OF THE INVENTION

The present invention is directed to a shielded panel assembly which may be disposed adjacent a vent opening in a shielded enclosure in order to provide EMI/RFI shielding to the opening.

In a preferred embodiment the shielded vent panel of the invention comprises an elongate member having two ends, a plurality of angular notches such that the member is jointed and may be folded to form a closed frame, and a gasket retaining means disposed lengthwise on said member; a resilient gasket having a plurality of angular notches at intervals such that the gasket may be folded in the same configuration as the frame and retained by the gasket retaining means; a corner fastening means which bridges the two ends of the member to secure the closed frame; and a conductive filter media panel disposed within the frame and retained by the gasket.

In the above embodiment, the elongate member may have three v-shaped notches such that the closed frame is square or rectangular, as the gasket retaining means a ridge disposed lengthwise on said member, and a gasket having a u-shaped cross-section such that it may be fitted over said retaining ridge.

In an alternate embodiment, the panel assembly of the invention comprises a plurality of elongate members, each having two ends, said members being fastened to each other at each end to form a closed frame, and having a gasket retaining means disposed adjacent the periphery of said closed frame; a resilient gasket having a plurality of v-shaped notches at intervals such that the gasket may be folded in the same configuration as said frame and retained by said gasket retaining means; a corner fastening means which joins the ends of said members to secure closed frame; and a conductive filter media panel disposed within said frame and retained by said gasket.

In a further embodiment, the panel assembly of the invention comprises an integral frame having a filter media panel bonded to a surface of the frame which is adjacent the surface of a shielded enclosure when the panel assembly is in use. In this embodiment the filter media may protrude from the surface of the frame such that when mounted upon the enclosure it is in electrical contact with the surface of the enclosure, thereby eliminating the need for a separate gasket. Alternately, a gasket may be retained by a gasket retaining means in the integral frame, e.g. disposed in a channel in the outer periphery of the frame, e.g. in the other embodiments of the invention, said gasket is disposed in the surface of the frame which is adjacent the enclosure when the panel assembly is in use.

In all of the above embodiments the filter media is preferably an expanded metal mesh, such as expanded MONEL ® metal. Alternately the filter media may be a honeycomb structure. The panel assembly may further comprise a dust filter panel and a dust filter retaining means.

The present invention is further directed to a method of shielding an opening in a EMI/RFI shielded enclosure by providing a shielded panel assembly according to the invention, and securing the shielded panel assembly to a shielded enclosure adjacent an opening in said enclosure.

DETAILED DESCRIPTION OF THE INVENTION

The shielded panel assembly of the invention comprises, in one embodiment, an elongate member having two ends, a plurality of angular notches such that the member is jointed and may be folded to form a closed frame, and a gasket retaining means disposed lengthwise on said member; a resiliant resilient gasket having a plurality of angular notches at intervals such that the gasket may, be folded in the same configuration as the frame and retained by the gasket retaining means; a corner fastening means which bridges the to ends of the member to secure the closed frame; and a conductive filter media panel disposed within the frame and retained by the gasket.

In an alternate embodiment, a plurality of elongate embers joined by a plurality of fastening means are used instead of a single elongate member to form the closed frame as described above.

Figure 1:
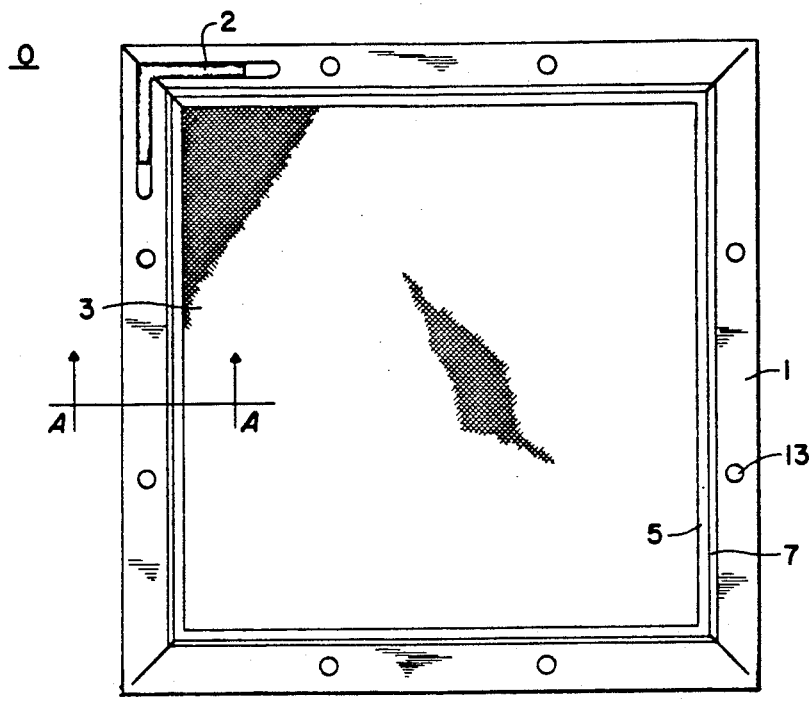
FIG. 1 is a top planar view of the assembled shielded panel according to one embodiment of the invention.

The assembled shielded panel 0, according to one embodiment of the invention, is shown in FIG. 1. According to the invention, the panel is easily-and economically manufactured by folding member 1 into the desired configuration (e.g. a rectangle, as shown), snapping the ends together to secure the frame with corner fastening means 2, placing the filter media panel 3 within the closed frame, where it is retained by lip 4 of the member (shown in FIG. 2), and press-fitting the gasket 5 onto the gasket retaining means (ridge 6 shown in FIG. 2 and discussed below). A portion of the gasket 5 overlaps the filter media panel as shown in the cross-sectional view of FIG. 2, thereby holding the filter media panel in the frame.

The elongate member or members may be of any suitable material which is lightweight and able to form a stable frame which is not easily deformed by the deflection of the gasket when the panel is secured to the enclosure, or during handling prior to installation. Plastic either thermoplastic or thermoset, is a particularly preferred material, as plastic is simple and economical to mold or extrude and forms a lightweight and durable frame. The angular notches in the member may be of any appropriate configuration which allows the member to be folded into a frame having the desired size and shape, e.g. v-shaped notches are generally used to form a rectangular frame. The number of notches is at least, and generally exactly, the number required to form the desired shape, e.g. three notches in a single member will form a square or rectangular frame.

Figure 3:
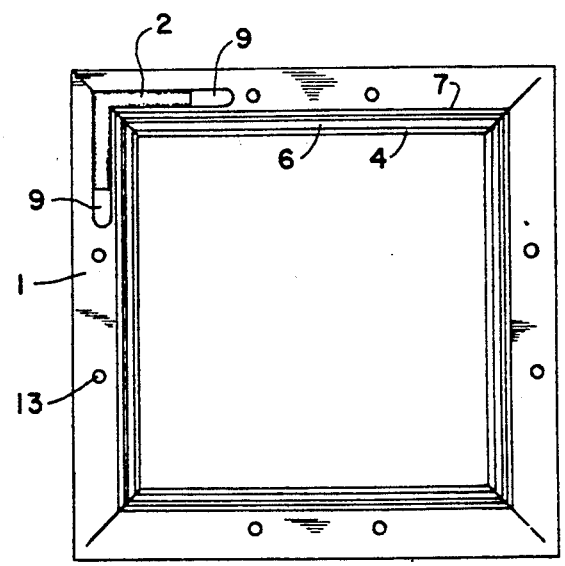
FIG. 3 is a top planar view of the closed frame with a preferred corner fastening means.

In FIG. 3, a rectangular closed frame is shown which has been formed from one elongate member having three v-shaped notches which form the corners of the frame. The ends of the member are secured by corner fastening means 2 as discussed below.

The dimensions of the elongate member are not critical, although it is desirable that the thickness and width be the minimum required to provide a stable frame, in order to minimize the weight of the frame.

Disposed lengthwise on the member or members is a gasket retaining means. The gasket retaining means may be integral with or attached to the surface of the member, and may be any means which will hold the gasket securely adjacent the periphery of the closed frame until the panel assembly is secured to an enclosure. (Once the panel is secured the gasket is deflected against, and held in place by, the surface of the enclosure.) Preferably the gasket overlaps the filter media panel, holding it in place as described previously. The intimate contact of the gasket and filter media also improves the conductivity and shielding effectiveness of the panel. The gasket may be either conductive or non-conductive, but is preferrably conductive. A preferred embodiment is shown in FIG. 2, in which the gasket 5 has a u-shaped cross-section and is press fit onto a ridge 6 disposed lengthwise on the member 1 (i.e. adjacent the periphery of the closed frame).

Optionally, a gasket compression stop is also disposed lengthwise on the member. The gasket compression stop prevents distortion of the closed frame when the panel is secured against the enclosure, by allowing the gasket to deflect only enough to ensure physical contact between the frame and enclosure, without creating mechanical stress on the frame. In one embodiment the gasket compression stop is a shoulder, such as shoulder 7 in FIG. 2.

Figure 2:
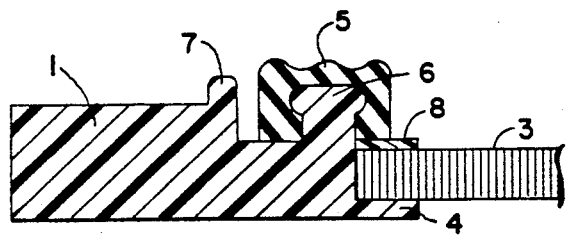
FIG. 2 is a cross-sectional view of the assembled panel, taken across line A—A in FIG. 2.

The panel of the invention may further comprise a shim 8, shown in FIG. 2, which prevents abrasion of the gasket where it overlaps the filter media panel. The shim is usually used in military applications, and is generally not used in conjunction with mesh gaskets, since these gaskets do not tend to abrade.

To form a closed frame, the ends of the folded member are bridged by a corner fastening means. (When a plurality of members are used they are fastened by a corner fastening means at each pair of abutting ends.) Any type of fastening means may be used which will secure the frame until it is attached to the enclosure. In the embodiment shown in FIG. 3, the fastening means 2 is a serrated metal bracket which snaps into channel 9 disposed at each end of the member.

In an alternate embodiment of the invention, the frame may be a single integral member. This integral frame may be formed using conventional methods including but not limited to die cutting, injection molding, saw cutting. The frame may be of any convenient material, such as metal, wood or plastic. Preferred materials are thermoplastics, as they are lightweight and easy to form. The frame may be in any desired shape and size, according to the size of the enclosure opening to be covered. In this embodiment the filter media panel may either be bonded or mechanically attached to the surface of the frame or disposed within a groove in the frame and retained by a gasket as described in the above embodiments. When the filter media panel is attached to the surface of the frame, it advantageously protrudes above the surface of the frame, making electrical contact with the enclosure when in use and obviating the need for a separate gasket. For example, in one such embodiment a polyvinyl chloride panel is formed into a rectangular frame (e.g. by die-cutting), and then a metal mesh panel is bonded into the surface of the polyvinyl chloride such that the metal mesh protrudes from the surface and makes intimate contact, with the metal of the enclosure when the assembly is in use. If a gasket is desired it may be retained by a gasket retaining means as previously described. In a preferred embodiment the gasket is disposed on a ridge such that part of the gasket overlaps the periphery of the filter media panel such that the filter media panel is retained in the frame, as described in the discussion of the previous embodiments. In a variation of this embodiment one or more hinged members are provided as described above, folded into a closed frame and the filter media panel is bonded thereto. The closed frame could advantageously be mechanically held together, e.g. by a jig, until the filter media panel is bonded thereto, thereby eliminating the need for a corner fastening means.

Figure 4:
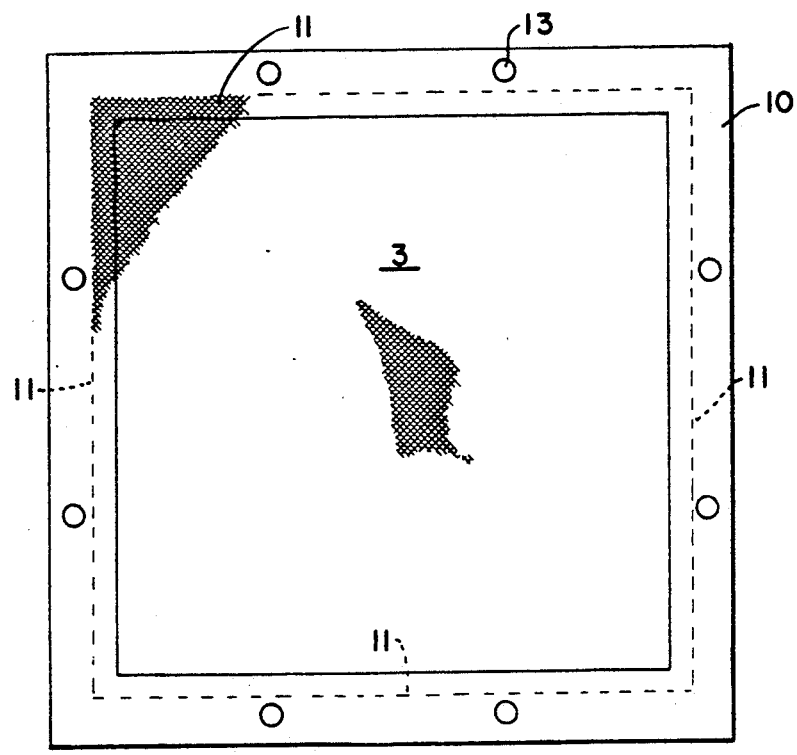
FIG. 4 is a top planar view of an alternate embodiment of the invention.

A panel assembly comprising an integral frame with a filter media panel bonded thereto is shown in FIG. 4. The filter media panel 3 is bonded to frame 10 and protrudes above the inner periphery of the frame in the overlap area 11.

According to the invention, the gasket may be any conventional type, such as an elastomeric or metal mesh gasket. The gasket may be electrically conductive or non-conductive, and its cross-sectional configuration will be dictated by the type of gasket retaining means used. Like the elongate member, the gasket has notches which allow it to be folded into the same configuration as the closed frame. There are generally the same number of notches in the gasket as in the member, and they are disposed along the length of the gasket at intervals corresponding to the notches on the member. If desired, a plurality of individual gasket strips may be used, which would be cut to fit the frame and disposed on the gasket retaining means as described above.

The conductive filter media panel may be of any material which is electrically and thermally conductive and transmits air flow. Conventional filter media which may be used includes, honeycomb structures, woven screen panels, and expanded or perforated metal. A preferred filter media is expanded metal, and especially preferred is expanded MONEL ® metal. It is desirable that the filter media be as thin and lightweight as possible to minimize the weight of the assembled shielded panel. The shielding effectiveness is dependent on the material used as the filter media panel. When the preferred expanded Monel ® metal is used the shielding effectiveness is generally from 40 to 50 dB at 1 GigaHertz. The type of frame used has a negligible effect on the shielding effectiveness.

Optionally, the shielded panel assembly of the invention may further comprise a dust filter. The dust filter comprises a dust filter media panel and/or a dust seal. The dust filter media panel is disposed parallel to the filter media panel, and is generally on the side which does not contact the enclosure when the panel assembly is in use so that contact between the filter media panel and gasket is maintained. The dust filter panel may be of any material which allows air flow while reducing the transmission of dust and airborne particles. Preferred materials for the dust filter panel are high porosity foams. The dust filter may be attached to the frame using any conventional method; a preferred method is to provide a dust filter retention slot in the frame into which the dust filter panel is fitted. Advantageously, the dust filter panel is removable for cleaning or replacement, e.g. by allowing the panel to slide in and out of a u-shaped dust filter retention slot which is open on one side. The dust seal is disposed adjacent to the gasket, on the side opposite the filter media panel. This seal contacts the enclosure surface when the shielded panel is in use, thereby preventing the intrusion of dust into the enclosure around the gasket/enclosure interface. The seal may be of any suitable material, preferred materials being high porosity foams.

Figure 5:
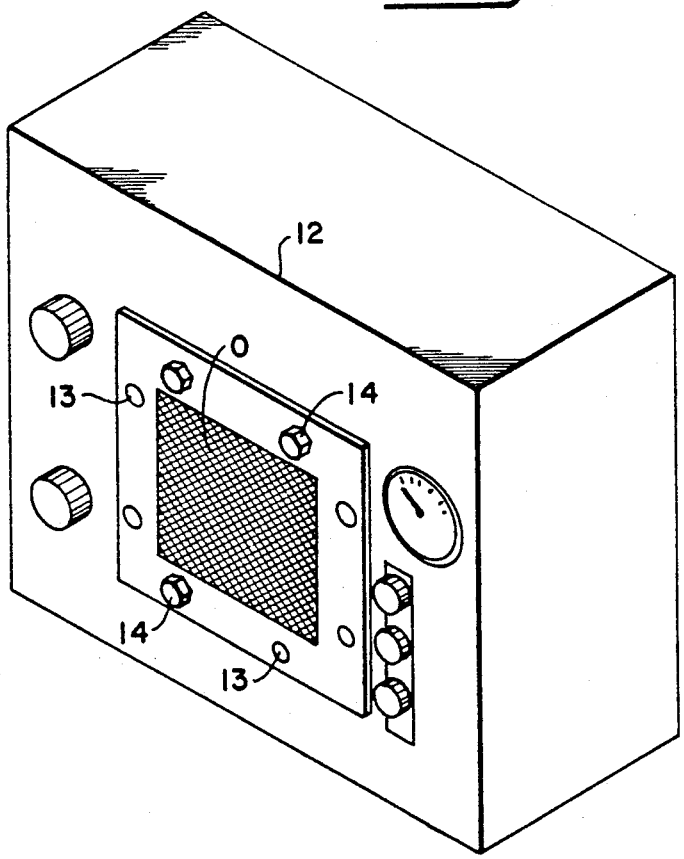
FIG. 5 shows the shielded panel assembly secured over an opening in a shielded enclosure.

After assembly the shielded vent panel is disposed over an opening in a shielded enclosure via a mounting means. The panel assembly may be mounted using any conventional method including mechanical fasteners or adhesives. A preferred method is to bolt or screw the panel onto the enclosure through holes in the frame. This mounting method is shown in FIG. 5, in which the shielded panel 0, as shown in FIG. 1, is attached to enclosure 12 by bolts or screws 14 through holes 13 disposed on the periphery of the frame.

While preferred embodiments of the invention have been described in detail hereinabove, it is to be understood that many variations and modifications may be made by those skilled in the art without separating from the scope and spirit of the invention.

What is claimed is:

1. A panel assembly disposed adjacent a vent opening in a shielded enclosure comprising: a an elongate member having two ends, a plurality of angular notches such that said member is jointed and may be folded to form a closed frame, and a gasket retaining means disposed lengthwise on said member;
   b. a resilient gasket having a plurality of angular notches at intervals such that the gasket may be folded in the same configuration as said frame and retained by said gasket retaining means;
   c. a corner fastening means which bridges the two ends of the member to secure the closed frame; and
   d. a conductive filter media panel disposed within said frame and retained by said gasket.

2. The panel assembly of claim 1 wherein the member has three v-shaped notches such that the closed frame is square or rectangular.

3. The panel assembly of claim 1 wherein the gasket retaining means is a ridge disposed lengthwise on said member.

4. The panel assembly of claim 3 wherein the gasket has a u-shaped cross-section such that it may be fitted over said retaining ridge.

5. The panel assembly of claim 1 wherein said filter media is expanded metal mesh.

6. The panel assembly of claim 5 wherein said expanded metal mesh is expanded MONEL ® metal.

7. The panel assembly of claim 1 wherein said filter media panel is a honeycomb structure.

8. The panel assembly of claim 1 further comprising a dust filter panel and a dust filter retaining means.

9. The panel assembly of claim 8 wherein said dust filter retaining means is a groove disposed lengthwise in the member in the plane perpendicular to the plane of the filter media.

10. The panel assembly of claim 1 further comprising a shim disposed between said gasket and said filter media panel.

11. The panel assembly of claim 1 further comprising a mounting means by which the panel assembly may be secured to a shielded enclosure.

12. The panel assembly of claim 11 wherein said mounting means comprises a plurality of holes through the frame, perpendicular to the plane of the filter media panel, through which fastening means may be engaged.

13. The panel assembly of claim 1 wherein the gasket is electrically conductive.

14. The panel assembly of claim 1 further comprising a gasket compression stop.

15. The panel assembly of claim 1 wherein the member is plastic.

16. The panel assembly of claim 1 wherein the member is aluminum.

17. A panel assembly disposed adjacent a vent opening in a shielded enclosure comprising:
   a. a plurality of elongate members, each having two ends, said members being fastened to each other at each end to form a closed frame, and having a gasket retaining means disposed adjacent the periphery of said closed frame;
   b. a resilient gasket having a plurality of v-shaped notches at intervals such that the gasket may be folded in the same configuration as said frame and retained by said gasket retaining means;
   c. a corner fastening means which joins the ends of said members to secure the closed frame; and
   d. a conductive filter media panel disposed within said frame and retained by said gasket.

18. The panel assembly of claim 17 wherein the frame is formed by two members, each member having v-shaped notches such that the members may be folded to form a closed frame which is square or rectangular.

19. The panel assembly of claim 17 wherein the gasket retaining means is a ridge disposed lengthwise on each said member.

20. The panel assembly of claim 19 wherein the gasket has a u-shaped cross-section such that it may be fitted over said retaining ridge.

21. The panel assembly of claim 17 wherein said filter media is expanded metal mesh.

22. The panel assembly of claim 21 wherein said expanded metal mesh is expanded MONEL ® metal.

23. The panel assembly of claim 17 wherein said filter media panel is a honeycomb structure.

24. The panel assembly of claim 17 further comprising a dust filter panel and a dust filter retaining means.

25. The panel assembly of claim 24 wherein said dust filter retaining means is a groove disposed on the periphery of the frame in the plane perpendicular to the plane of the filter media.

26. The panel assembly of claim 17 further comprising a shim disposed between said gasket and said filter media panel.

27. The panel assembly of claim 17 further comprising a mounting means by which the panel assembly may be secured to a shielded enclosure.

28. The panel assembly of claim 27 wherein said mounting means comprises a plurality of holes through the frame, perpendicular to the plane of the filter media panel, through which fastening means may be engaged.

29. The panel assembly of claim 17 wherein the gasket is electrically conductive.

30. The panel assembly of claim 17 further comprising a gasket compression stop.

31. The panel assembly of claim 17 wherein the members are plastic.

32. The panel assembly of claim 17 wherein the members are aluminum.

33. A panel assembly disposed adjacent a vent opening in a shielded enclosure comprising:
(a) an integral plastic frame;
(b) an expanded metal mesh filter media panel attached to said integral frame.

34. A panel assembly disposed adjacent a vent opening in a shielded enclosure comprising:
a. a non-conductive integral frame;
b. a gasket retaining means disposed on a periphery of said frame;
c. a resilient gasket retained by said gasket retaining means; and
d. a filter media panel disposed within said frame and retained by said gasket.

35. The panel assembly of claim 34 wherein said frame is thermoplastic.

36. The panel assembly of claim 34 wherein said filter media panel is expanded metal mesh.

37. The panel assembly of claim 34 wherein the gasket retaining means is a ridge disposed on the periphery of one surface of the frame.

38. A panel assembly disposed adjacent a vent opening in a shielded enclosure comprising:
a. an elongate member having two ends, a plurality of angular notches such that said member is jointed and may be folded to form a closed frame;
b. a filter media panel attached to the periphery of said frame.

39. The panel assembly of claim 38 wherein said filter media is expanded metal mesh.

40. A method of shielding an opening in an EMI/RFI shielded enclosure comprising the steps of:
a. providing a shielded panel assembly comprising:
i. a plurality of elongate members, each member having two ends, said ends being fastened so as to form a closed frame, and having a gasket retaining means disposed adjacent the periphery of said closed frame;
ii. a resilient gasket having a plurality of v-shaped notches at intervals such that the gasket may be folded in the same configuration as said frame and retained by said gasket retaining means;
iii. a corner fastening means which joins the ends of said members to secure the closed frame; and
iv. a conductive filter media panel disposed within said frame and retained by said gasket; and
b. securing said shielded panel assembly to a shielded enclosure adjacent an opening in said enclosure.

41. A method of shielding an opening in an EMI/RFI shielded enclosure comprising the steps of:
(a) providing a shielded panel assembly comprising:
i. an integral plastic frame;
ii. an expanded metal mesh filter media panel attached to said integral frame; and
(b) securing said shielded panel assembly to a shielded enclosure adjacent an opening in said enclosure.

42. A method of shielding an opening in an EMI/RFI shielded enclosure comprising the steps of:
a. providing a shielded panel assembly comprising:
i. a non-conductive integral frame;
ii. a gasket retaining means disposed on a periphery of said frame;
iii. a resilient gasket retained by said gasket retaining means; and
iv. a filter media panel disposed within said frame and retained by said gasket; and
b. securing said shielded panel assembly to a shielding enclosure adjacent an opening in said enclosure.

43. The method of claim 42 wherein said frame is thermoplastic.

44. The method of claim 42 wherein said filter media panel is expanded metal mesh.

45. The method of claim 42 where the gasket retaining means is a ridge disposed on the periphery of one surface of the frame.

46. A method of shielding an opening in an EMI/RFI shielded enclosure comprising the steps of:
a. providing a shielded panel assembly comprising:
i. an elongate member having two ends, a plurality of angular notches such that said member is jointed and may be folded to form a closed frame, and a gasket retaining means disposed lengthwise on said member;
ii. a resilient gasket having a plurality of angular notches at intervals such that the gasket may be folded in the same configuration as said frame and retained by said gasket retaining means;
iii. a corner fastening means which bridges the two ends of the member to secure the closed frame; and
iv. a conductive filter media panel disposed within said frame and retained by said gasket; and
b. securing said shielded panel assembly to a shielded enclosure adjacent an opening in said enclosure.

* * * * *

UNITED STATES PATENT AND TRADEMARK OFFICE
CERTIFICATE OF CORRECTION

PATENT NO. : 5,032,689
DATED : July 16, 1991
INVENTOR(S) : Halligan et al.

It is certified that error appears in the above—identified patent and that said Letters Patent is hereby corrected as shown below:

On the cover page, inset:

"Assignee: Chomerics, Inc."

Signed and Sealed this

Sixteenth Day of February, 1993

*Attest:*

STEPHEN G. KUNIN

*Attesting Officer*     *Acting Commissioner of Patents and Trademarks*